US008679935B2

(12) United States Patent
Lee et al.

(10) Patent No.: US 8,679,935 B2
(45) Date of Patent: Mar. 25, 2014

(54) METHODS OF FABRICATING A SEMICONDUCTOR DEVICE HAVING METALLIC STORAGE NODES

(75) Inventors: Mongsup Lee, Seoul (KR); Inseak Hwang, Suwon-si (KR); Byoung-Yong Gwak, Suwon-si (KR); Sukhun Choi, Suwon-si (KR); Sang-Jun Lee, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 191 days.

(21) Appl. No.: 13/303,500

(22) Filed: Nov. 23, 2011

(65) Prior Publication Data
US 2012/0231601 A1    Sep. 13, 2012

(30) Foreign Application Priority Data

Mar. 8, 2011    (KR) .......................... 10-2011-0020515

(51) Int. Cl.
*H01L 21/20*    (2006.01)
(52) U.S. Cl.
USPC ............................ 438/381; 438/397; 438/398

(58) Field of Classification Search
USPC ................... 438/244, 255, 381, 478, 397, 398
See application file for complete search history.

(56) References Cited

U.S. PATENT DOCUMENTS

| 7,259,061 | B2 | 8/2007 | Kundalgurki |
| 2005/0124113 | A1* | 6/2005 | Yoneda .......................... 438/255 |
| 2010/0230382 | A1* | 9/2010 | Narahashi et al. ............... 216/13 |

FOREIGN PATENT DOCUMENTS

| KR | 10-1999-0039101 | 6/1999 |
| KR | 12-0223831 | 7/1999 |
| KR | 10-2004-0061819 | 7/2004 |
| KR | 1020040061819 A * | 7/2004 |

* cited by examiner

*Primary Examiner* — George Fourson, III
*Assistant Examiner* — Wilner Jean Baptiste
(74) *Attorney, Agent, or Firm* — Muir Patent Consulting, PLLC

(57) ABSTRACT

The present disclosure describes methods of fabricating a semiconductor device. An exemplary method includes forming a metal pattern on a substrate and etching the metal pattern using an etchant including at least an alkaline solution and an oxidant to form a metal electrode, where at least a portion of the surface of the metal electrode is uneven.

20 Claims, 14 Drawing Sheets

METHODS OF FABRICATING A SEMICONDUCTOR DEVICE HAVING METALLIC STORAGE NODES

CROSS-REFERENCE TO RELATED APPLICATIONS

This U.S. non-provisional patent application claims priority under 35 U.S.C. §119 to Korean Patent Application No. 10-2011-0020515, filed on Mar. 8, 2011, the entirety of which is incorporated by reference herein.

BACKGROUND

The present disclosure herein relates to methods of fabricating a semiconductor device and, more particularly, to methods of fabricating a semiconductor device having metallic storage nodes.

Semiconductor devices, such as dynamic random access memory (DRAM) devices, may employ cell capacitors as data storage elements. As semiconductor devices become more highly integrated, the size of the cell capacitors has been gradually reduced. As cell capacitors become smaller, capacitance of the cell capacitors may become reduced and the soft error rate (SER) of the capacitors may increase. An increase in the SER may be due to alpha particles.

SUMMARY

Embodiments of the present disclosure are directed to methods of fabricating a semiconductor device.

An exemplary method of fabricating a semiconductor device comprises the steps of forming a metal pattern on a substrate, forming a supporter to support the metal pattern, and etching the metal pattern using an etchant including at least an alkaline solution and an oxidant to form a metal electrode, wherein at least a part of a surface of the metal electrode is uneven.

An exemplary method of fabricating a dynamic random access memory (DRAM) cell comprises the steps of forming a substrate including one or more electrodes and an active region, sequentially forming a first mold layer, a support layer and a second mold layer on the substrate, forming a metal pattern penetrating the first mold layer, the support layer and the second mold layer, and wet etching at least a part of a surface of the metal pattern using a wet etchant to form a metal electrode, wherein the part of the surface of the metal electrode that has been formed by etching is uneven.

An exemplary method of fabricating a dynamic random access memory (DRAM) cell comprises the steps of forming a substrate including one or more electrodes and an active region, sequentially forming a first mold layer, a support layer and a second mold layer on the substrate, forming a metal pattern penetrating the first mold layer, the support layer and the second mold layer, and etching the metal pattern to form a metal electrode, wherein a first part of a surface of the metal electrode is perpendicular to a surface of the substrate and a second part of the surface of the metal electrode is parallel to a surface of the substrate, and the first and the second parts of a surface of the metal electrode include a jagged surface.

BRIEF DESCRIPTION OF THE DRAWINGS

The above and other aspects and features of the disclosure will become more apparent by describing in detail exemplary embodiments thereof with reference to the attached drawings, in which:

FIG. 13b is a close-up view of A2 in FIG. 13a.

FIG. 14b is a close-up view of B2 in FIG. 14a.

DETAILED DESCRIPTION OF THE EMBODIMENTS

Figure 1:
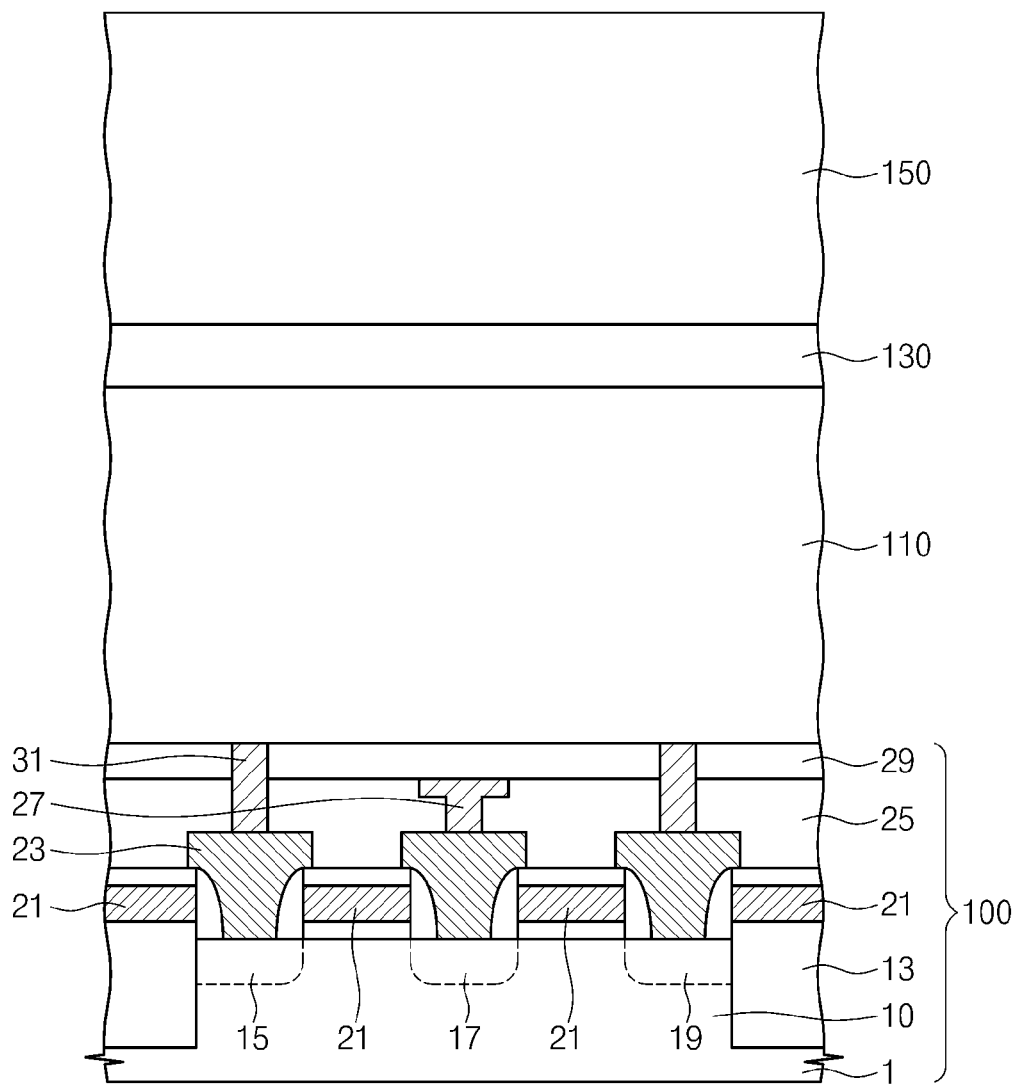
FIGS. 1 to 6 depict cross sectional views illustrating a method of fabricating a semiconductor device according to an exemplary embodiment.

The present disclosure will now be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

The terminology used herein is for the purpose of describing particular embodiments only and is not intended to be limiting of the invention. As used herein, the singular terms "a," "an" and "the" should not exclude the plural forms as well, unless the context clearly indicates otherwise. As used herein, the term "and/or" includes any and all combinations of one or more of the associated listed items. It will be understood that when an element or layer is referred to as being "on," "connected," or "coupled" to another element or layer, it may be directly on, connected or coupled to the other element or layer or intervening elements or layers may be present. In contrast, when an element or layer is referred to as being "directly on," "directly connected," or "directly coupled" to another element or layer, there are no intervening elements or layers present.

Similarly, it will be understood that when an element such as a layer, region or substrate is referred to as being "between" two different elements, it can be directly interposed between the two different elements without any intervening element or intervening elements may be present therebetween. In contrast, when an element is referred to as being "directly between" two different elements, there are no intervening elements present.

It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Embodiments in the detailed description will be described referring to plan views and/or sectional views by way of ideal schematic views. Accordingly, the exemplary views may be modified depending on manufacturing techniques and/or tolerances. Therefore, the disclosed embodiments are not limited to those shown in the views, but include modifications in configuration formed on the basis of the manufacturing processes.

It will be also understood that, although the terms first, second, third etc. may be used herein to describe various elements, these elements should not be limited by these terms. These terms are only used to distinguish one element from another element. Thus, a first element in some embodiments could be termed a second element, and, similarly, a second element could be termed a first element without departing from the teachings of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art/or or the present application, and should not be interpreted in an idealized or overly formal sense unless expressly defined so herein.

Metal electrodes may be employed as storage nodes of the semiconductor devices to improve characteristics of the cell capacitors. In order to increase the capacitance of the cell capacitors, it may be beneficial to increase a surface area of the metal electrodes of the cell capacitors. If the height of the metal electrodes is increased, at least one of the metal electrodes may lean to contact the adjacent metal electrode. This leaning effect may cause a malfunction during operation of the semiconductor device. In order to solve the leaning effect, a supporter may be disposed between the metal electrodes. The supporter may be formed of a silicon nitride layer having an etch selectivity that corresponds to a silicon oxide layer used in the formation of mold layers and/or interlayer dielectric layers.

The metal patterns may be etched using an acid solution to form metal electrodes that have an uneven surface. The supporter formed of a silicon nitride layer may be etched or removed by the acid solution because the silicon nitride layer exhibits a relatively high etching rate in the acid solution. The supporter may be damaged while the metal patterns are etched using the acid solution.

FIGS. 1 to 6 are cross sectional views illustrating a method of fabricating a semiconductor device according to an exemplary embodiment.

Referring to FIG. 1, an isolation layer 13 is formed at a predetermined region of a substrate 1 to define an active region 10. The substrate 1 may be a semiconductor substrate. In one embodiment, a plurality of insulated gate electrodes 21 are formed to extend across the active region 10 and the isolation layer 13. In one embodiment, the insulated gate electrodes 21 are word lines. Impurity ions may be implanted into the substrate 1 using the word lines 21 as an implantation mask, forming a common drain region 17 and a pair of source regions 15 and 19. As illustrated in FIG. 1, a pair of word lines 21 are formed to extend across the active region 10. The common drain region 17 may be formed in the active region 10 between the pair of word lines 21 extending across the active region 10. The pair of source regions 15 and 19 may be formed at both ends of the active region 10, respectively.

In one embodiment, a plurality of contact pads 23 are formed on the substrate on which the common drain region 17 and the source regions 15 and 19 have been formed. One of the contact pads 23 may be electrically connected to the common drain region 17; the other two contact pads 23 may be electrically connected to the source regions 15 and 19 respectively.

In one embodiment, an insulation layer 25 is formed on the substrate on which the contact pads 23 have been formed, and a bit line 27 is formed in the insulation layer 25. The bit line 27 may be electrically connected to the common drain region 17. An etch stop layer 29 may be formed on the substrate on which the bit line 27 has been formed. A pair of contact plugs 31 may be formed to penetrate the etch stop layer 29 and the insulation layer 25. One of the pair of contact plugs 31 may be electrically connected to the source region 15, and the other contact plug 31 may be electrically connected to the source region 19.

In one embodiment, a first mold layer 110 and a second mold layer 150 are sequentially formed on the substrate 100 on which the pair of contact plugs 31 has been formed. The first and second mold layers 110 and 150 may be formed, for example, of a silicon oxide layer. In one embodiment, a support layer 130 is formed between the first and second mold layers 110 and 150. The support layer 130 may be formed, for example, of a material layer having a lower etch rate than the first and second mold layers 110 and 150. For example, the support layer 130 may be formed of a silicon nitride layer.

Figure 2:
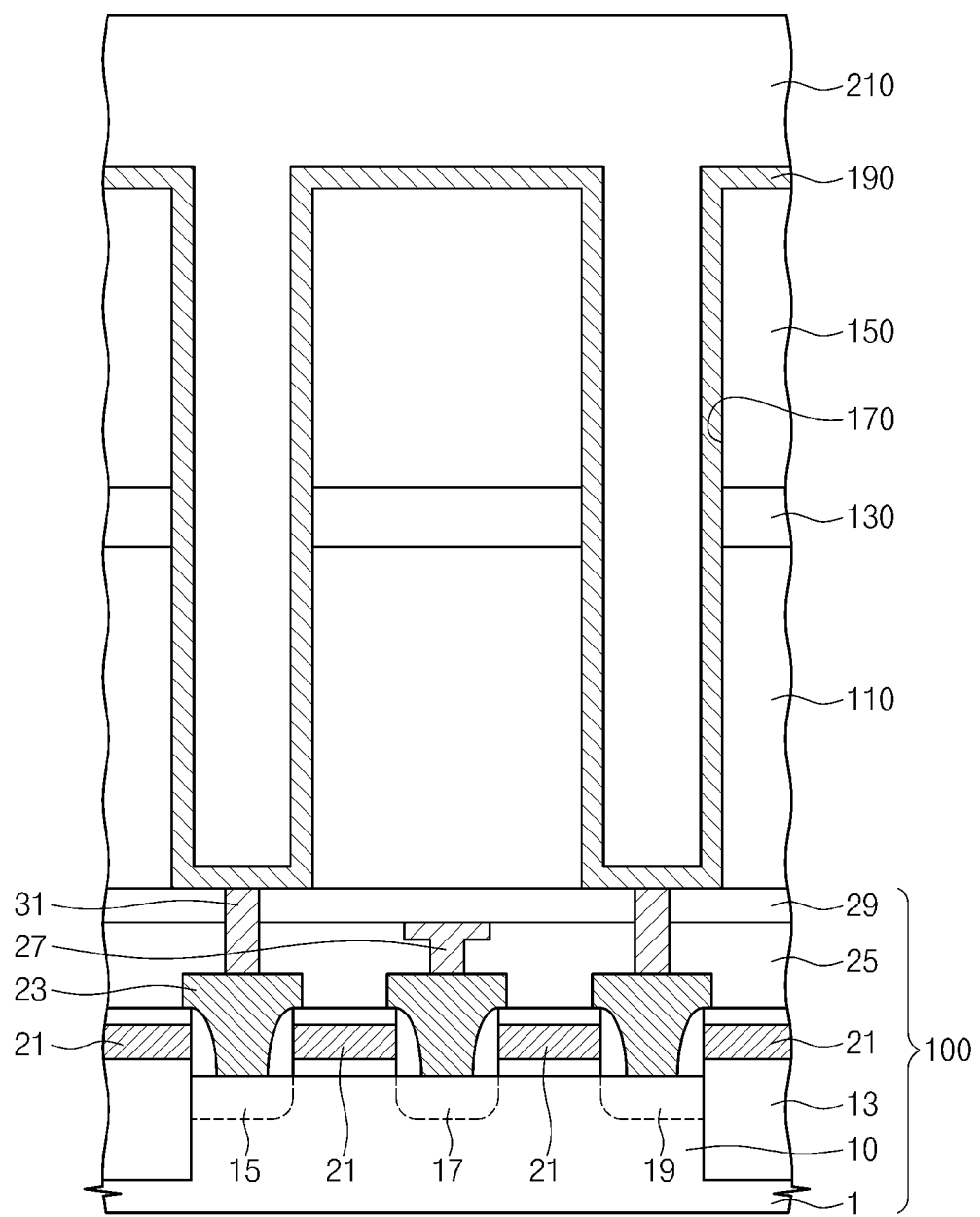

Referring to FIG. 2, the second mold layer 150, the support layer 130 and the first mold layer 110 are patterned to form an opening 170 that penetrates the second mold layer 150, the support layer 130 and the first mold layer 110. The opening 170 may be formed to have a circular hole shape in a plan view. The shape of the opening 170, however, is not limited to the examples described herein.

Figure 3:
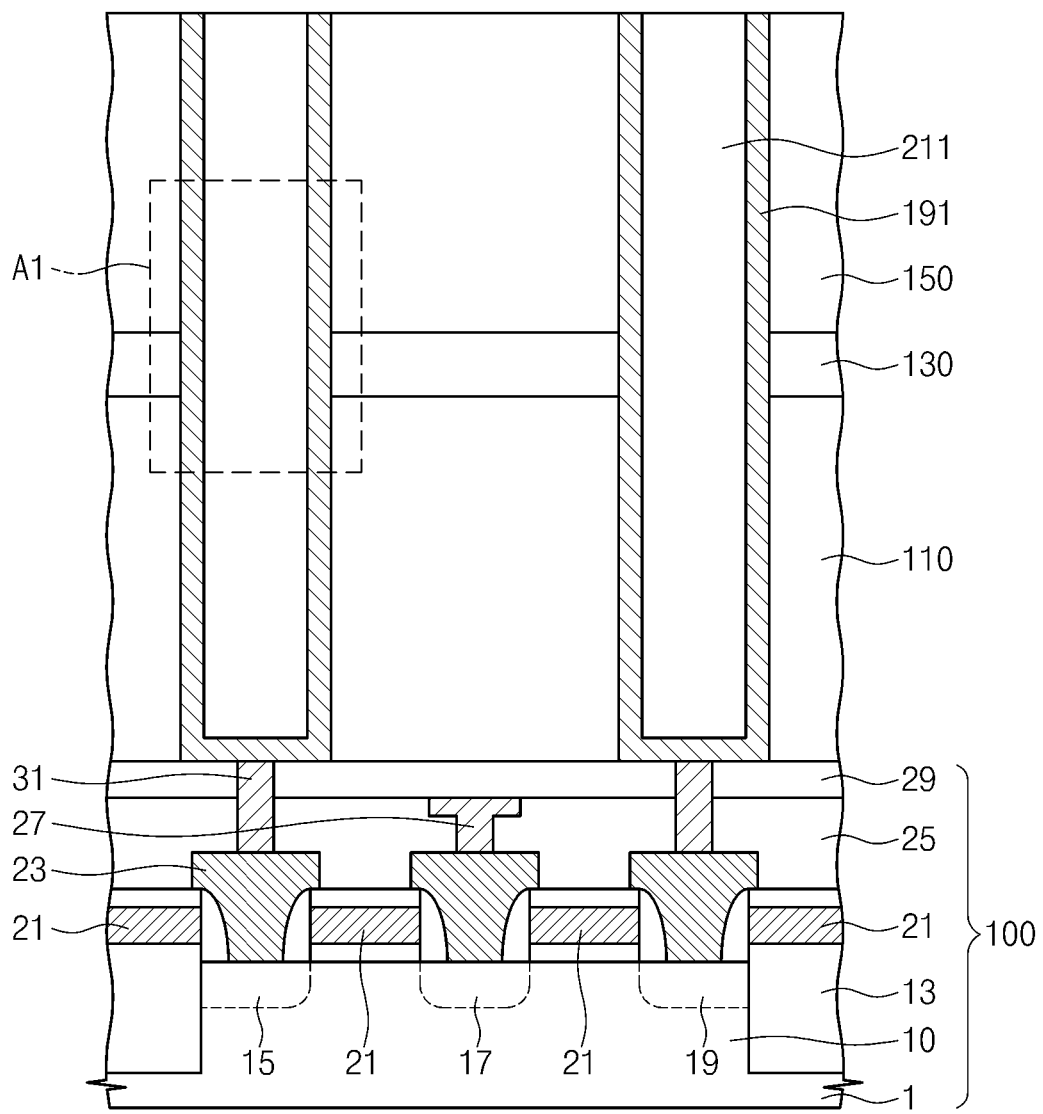

A conductive layer 190 is formed on the substrate on which the opening 170 is formed. For example, the conductive layer 190 may be conformally formed along the side walls and bottom of the opening so as to not fully fill the opening 170. The conductive layer 190 may be formed, for example, of a metal layer. The conductive layer 190 may be formed to include at least one of a titanium layer, a titanium nitride layer, a ruthenium layer, a tungsten layer, a tungsten nitride layer, a tantalum layer and a tantalum nitride layer. In one embodiment, a sacrificial layer 210 is formed on the substrate on which the conductive layer 190 has been formed. In one embodiment, the sacrificial layer 210 may be formed, for example, of a silicon oxide layer. In one embodiment, the sacrificial layer 210 may be formed of a material layer having a high etch selectivity in comparison to the first and second mold layers 110 and 150. Referring to FIG. 3, the sacrificial layer 210 and the conductive layer 190 are polished to expose a top surface of the second mold layer 150. As a result, a metal pattern 191 and a sacrificial pattern 211 may be formed in each of the openings 170. In one embodiment, the polishing process is performed using a chemical mechanical polishing (CMP) technique. Other polishing techniques may also be used to polish the sacrificial layer 210 and the conductive layer 190. In one embodiment, the metal pattern 191 may be formed to have a cylindrical shape with a major axis that is perpendicular to a main surface of the substrate 100. The shape and orientation of the metal pattern 191, however, is not limited to the examples described herein.

Figure 4:
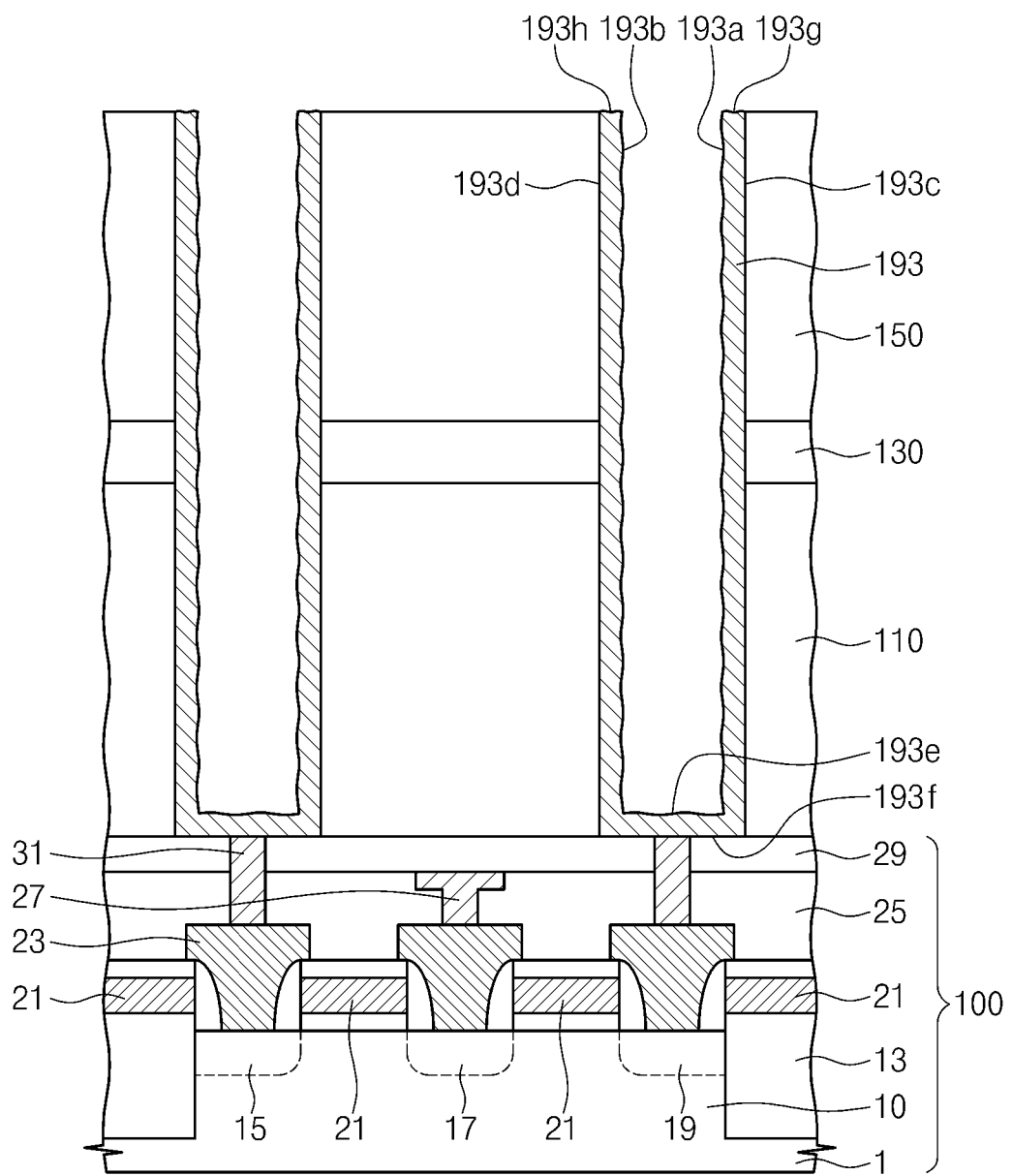

Referring to FIG. 4, the sacrificial pattern 211 is removed. In one embodiment, after removal of the sacrificial pattern 211, the metal pattern 191 is etched using an etchant to form a metal electrode 193 having an uneven surface in each of the openings 170. The metal electrode 193 may have a first and second inner sidewall 193a and 193b, a first and second outer sidewall 193c and 193d, a first and second bottom surface 193e and 193f and a first and second top surface 193g and 193h. In one embodiment, the surfaces 193a, 193b, 193e, 193g and 193h have been subject to etching, while surfaces 193c, 193d, and 193f have not been subject to etching.

In one embodiment, only the surface of the metal electrode 193 that has been subject to etching is uneven. In this embodiment, the remainder of the surface of the metal electrode 193 is even. In one embodiment, each surface or portion of a surface of the metal electrode 193 that has not been subject to etching may be parallel with or perpendicular to a surface of the substrate 1. For example, the bottom surface 193f of the metal electrode 193 that has not been subject to etching may be parallel with the bottom surface of the substrate 1 and/or with the etch stop layer 29. In one embodiment, a portion of a surface of the metal electrode 193 that has not been subject to etching may be perpendicular a surface of the substrate 1. For example, outer sidewall 193d of the metal electrode 193 that has not been subject to etching may be perpendicular to the bottom surface of the substrate 1 and/or the etch stop layer 29. In one embodiment, the metal electrode 193 serves as a metallic storage node of DRAM cells.

In one embodiment, the etchant includes at least an alkaline solution and an oxidant. The alkaline solution may include, for example, at least one of ammonium hydroxide ($NH_4OH$), tetra-methyl ammonium hydroxide (TMAH), sodium hydroxide (NaOH), potassium hydroxide (KOH) and choline ($C_5H_{15}O_2N$). The oxidant may include, for example, at least one of hydrogen peroxide ($H_2O_2$), ozone ($O_3$), sulfuric acid ($H_2SO_4$) and nitric acid ($HNO_3$). In one embodiment, the etchant may be formed by mixing hydrogen peroxide ($H_2O_2$), ammonium hydroxide ($NH_4OH$) and de-ionized water in a volume ratio of, for example, 4:1:20, respectively.

In another embodiment, the etchant further includes at least one of a chelating agent and a fluoride. The chelating agent may include, for example, at least one of an aliphatic amine type compound, a thiol type compound, a crown ether type compound, a hetero aromatic type compound and a carboxylic acidic type compound. The fluoride may include, for example, at least one of hydrofluoric acid (HF) and ammonium fluoride ($NH_4F$).

In one embodiment, the etchant is capable of etching the metal patterns 191 to form the uneven surfaces of the metal electrode 193. In this embodiment, the use of the etchant also does not result in damage to the support layer 130 during the formation of the uneven surfaces of the metal electrode 193.

Figure 5:
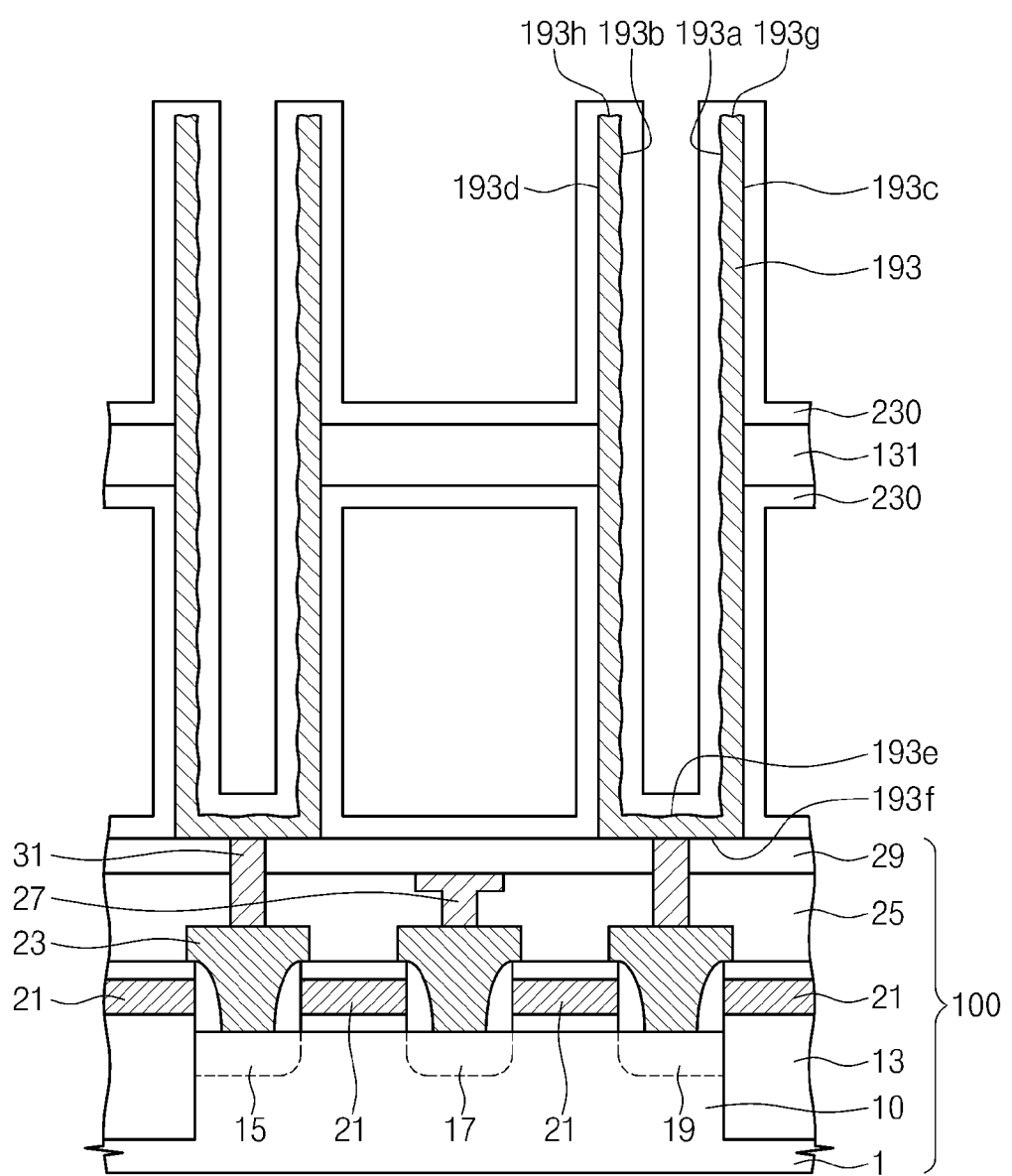

Referring to FIG. 5, in one embodiment, the second mold layer 150 is removed after formation of the metal electrode 193. After removal of the second mold layer 150, the support layer 130 is patterned to form a supporter 131 that exposes portions of a top surface of the first mold layer 110. After formation of the supporter 131, the first mold layer 110 may be removed. In one embodiment, a conformal dielectric layer 230 is formed on an entire surface of the remaining substrate 100 after the first mold layer 110 is removed. The dielectric layer 230 may be formed, for example, of a high-k dielectric layer having a dielectric constant higher than a dielectric constant of a silicon oxide layer. For example, the dielectric layer 230 may be formed of one of a lanthanum oxide (LaO) layer and a hafnium oxide (HfO) layer.

Figure 6:
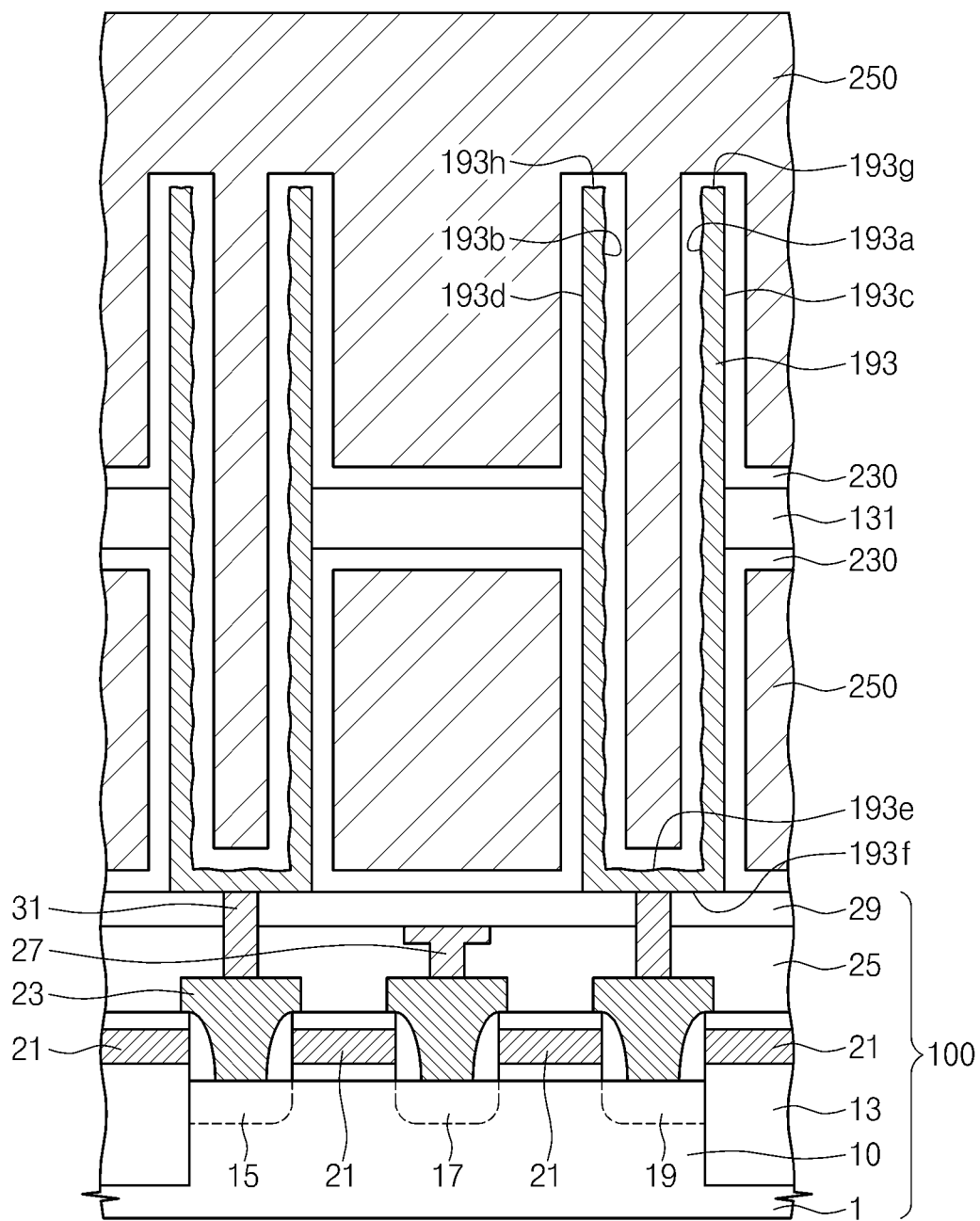

Referring to FIG. 6, a plate electrode 250 is formed on the substrate on which the dielectric layer 230 is formed. The plate electrode 250 may be formed of a metallic material. In one embodiment, the plate electrode 250 may cover the surfaces of the dielectric layer 230 such that it surrounds the inner and outer surfaces of the metal electrode 193. In one embodiment, the metal electrode 193, the plate electrode 250 and the dielectric layer 230 form a capacitor.

Now, a method of fabricating a semiconductor device according to another exemplary embodiment will be described with reference to FIGS. 7 to 9.

Figure 7:
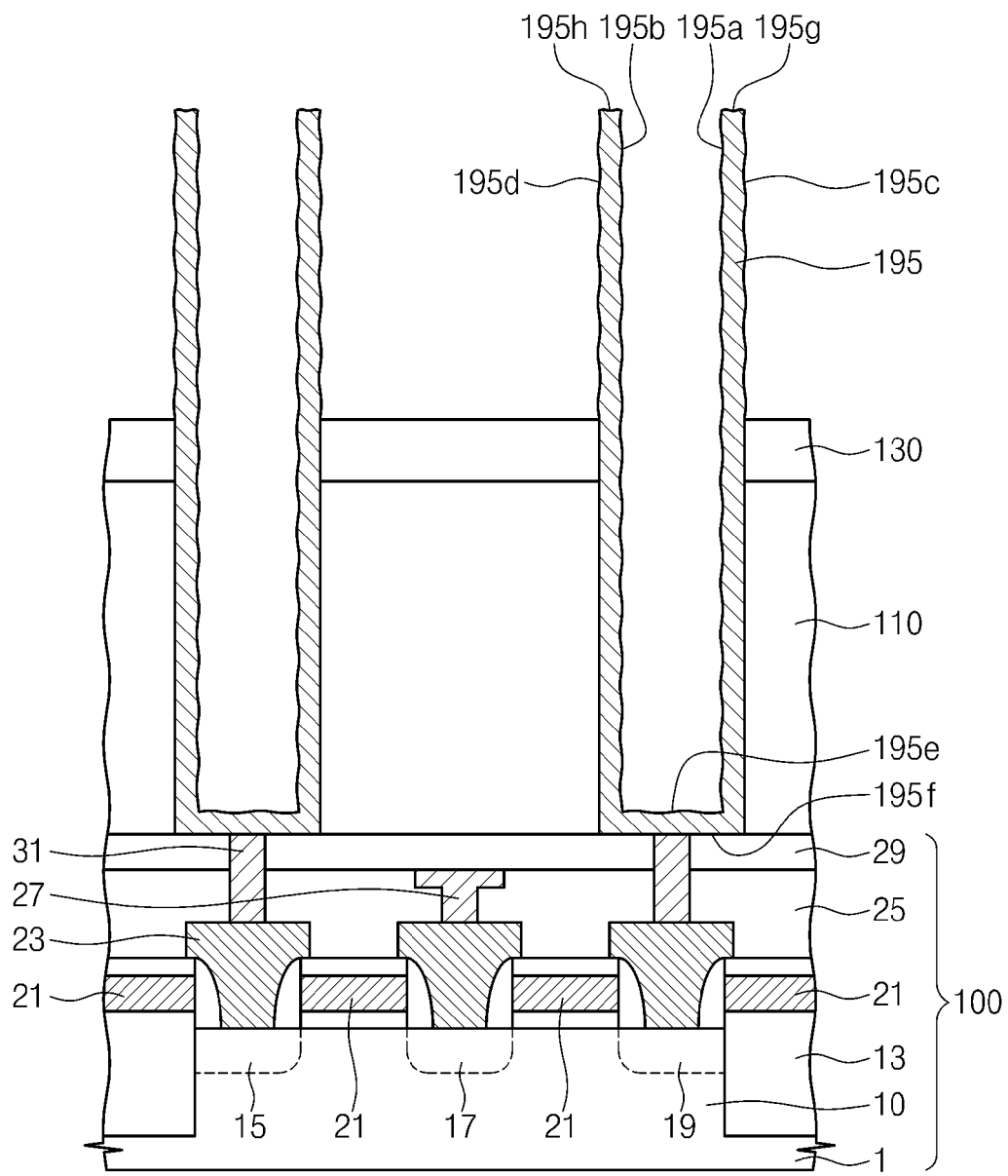
FIGS. 7 to 9 depict cross sectional views illustrating a method of fabricating a semiconductor device according to another exemplary embodiment.

Referring to FIG. 7, a substrate including metal patterns 191 is formed using an operation similar to that described with reference to FIGS. 1, 2, and 3. The sacrificial pattern 211 and the second mold layer 150 are then removed. After removal of the sacrificial pattern 211 and the second mold layer 150, the metal patterns 191 are etched using the etchant described in the previous embodiment, to form a metal electrode 195 with an uneven surface where the metal electrode 195 was etched. The metal electrode 195 may have a first and second inner sidewall 195a and 195b, a first and second outer sidewall 195c and 195d, a first and second bottom surface 195e and 195f and a first and second top surface 195g and 195h. In one embodiment, the surfaces 195a, 195b, 195e, 195g and 195h have been subject to etching, portions of surfaces 195c and 195d have been subject to etching, portions of surfaces 195c and 195d have not been subject to etching, and surface 195f has not been subject to etching.

In the present embodiment, the uneven surface may be formed at inner sidewalls 195a and 195b, a bottom surface and a portion of an outer sidewall of the metal electrode 195. In one embodiment, the portion of the outer sidewall of the metal electrode 195 with an uneven surface is located at a higher level than a top surface of the support layer 130. In one embodiment, the portion of the metal electrode 195 with an uneven surface is the portion that was exposed to the etchant during the etching process. In this embodiment, the remainder of the surface of the metal electrode 195 is even. In one embodiment, each surface or portion of a surface of the metal electrode 195 that has not been subject to etching may be parallel with or perpendicular to a surface of the substrate 1. For example, the bottom surface 195f of the metal electrode 195 that has not been subject to etching may be parallel with the bottom surface of the substrate 1 and/or with the etch stop layer 29. In one embodiment, a portion of the surface of the metal electrode 195 that has not been subject to etching may be perpendicular a surface of the substrate 1. For example, a portion of the outer sidewall 195c of the metal electrode 195 that has not been subject to etching may be perpendicular to the bottom surface of the substrate 1 and/or the etch stop layer 29.

Figure 8:
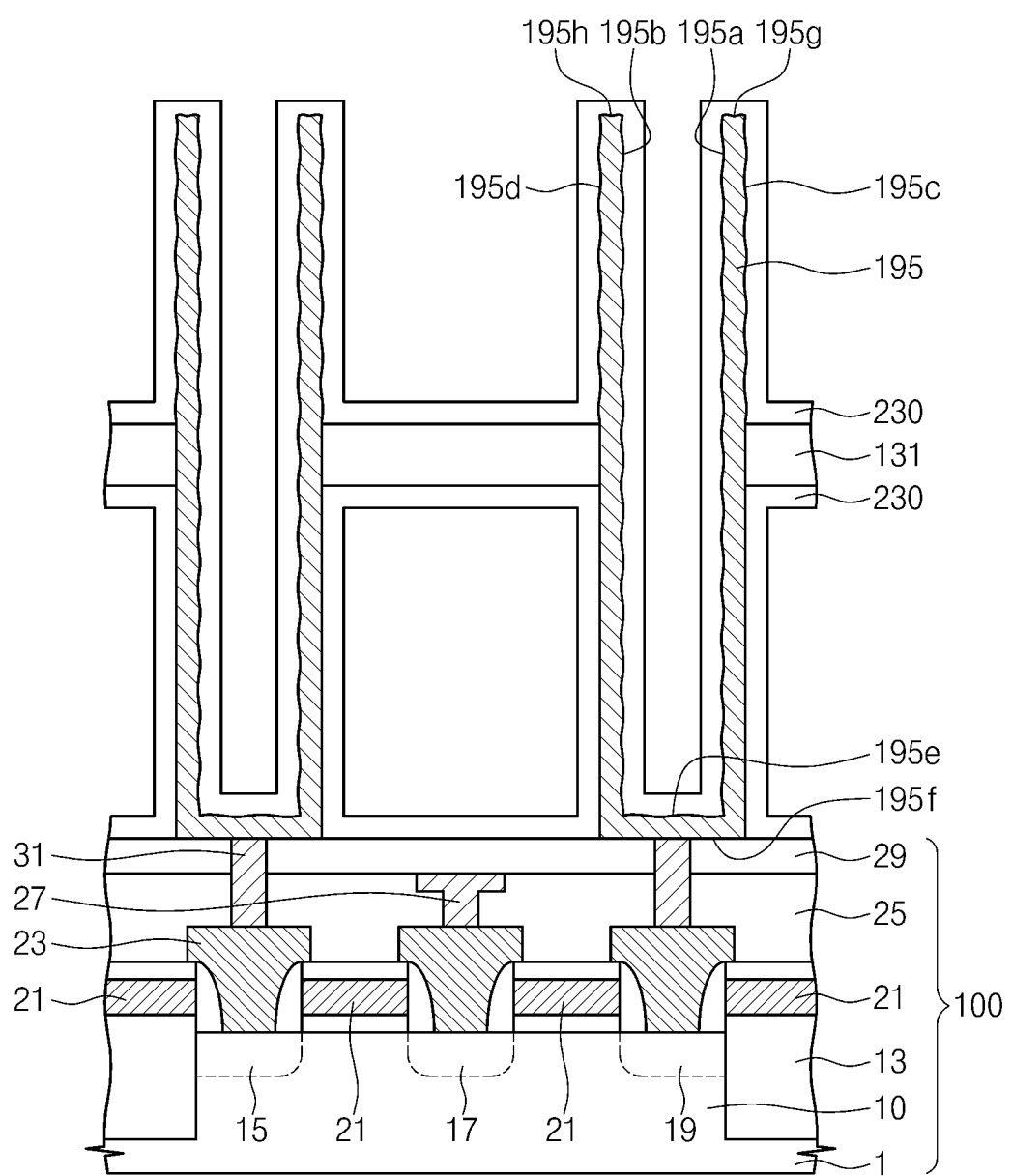

Referring to FIG. 8, after formation of the metal electrode 195, the support layer 130 may be patterned to form a supporter 131 that exposes the first mold layer 110. The first mold layer 110 may be removed after formation of the supporter 131. In one embodiment, a conformal dielectric layer 230 is formed on the resulting substrate after the first mold layer 110 is removed. The dielectric layer 230 may be formed of, for example, a high-k dielectric layer having a dielectric constant higher than a dielectric constant of a silicon oxide layer. For example, the dielectric layer 230 may be formed of one of a lanthanum oxide (LaO) layer and a hafnium oxide (HfO) layer.

Figure 9:
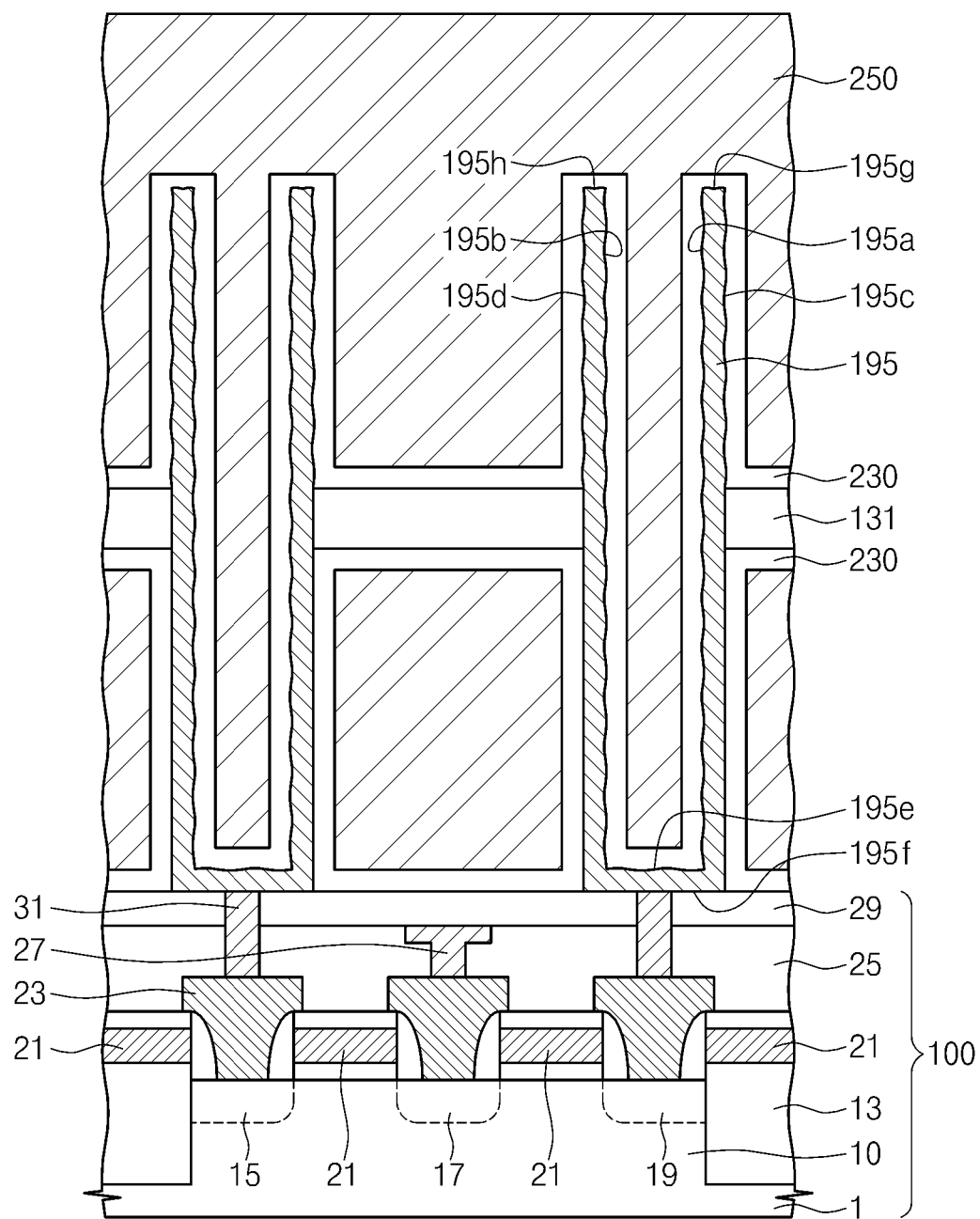

Referring to FIG. 9, a plate electrode 250 may be formed on the substrate on which the dielectric layer 230 is formed. The plate electrode 250 may be formed of a metallic material. For example, the plate electrode 250 may be a titanium nitride layer.

A method of fabricating a semiconductor device according to still another exemplary embodiment will be described with reference to FIGS. 10 to 12.

Figure 10:
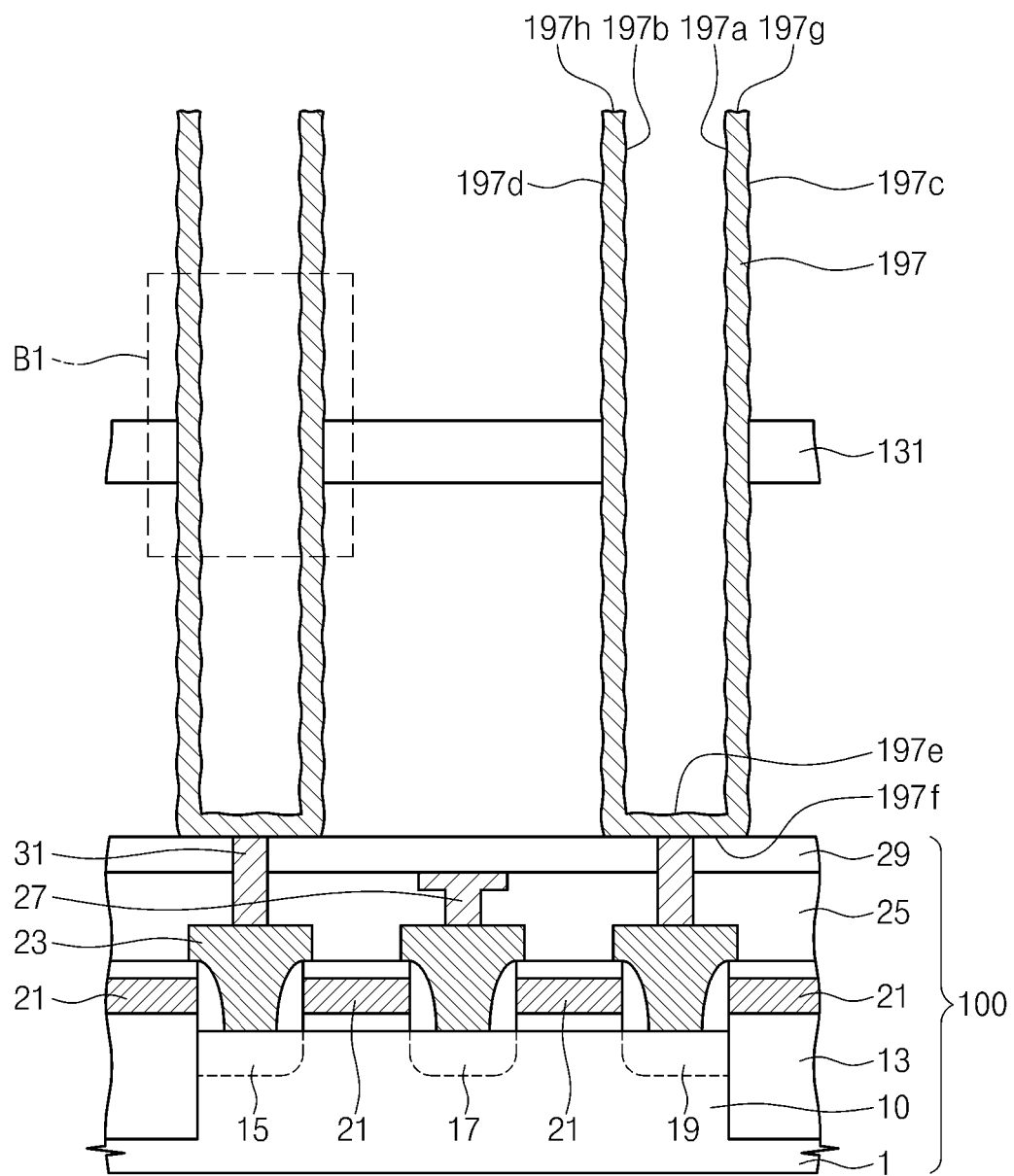
FIGS. 10 to 12 depict cross sectional views illustrating a method of fabricating a semiconductor device according to another exemplary embodiment.

Referring to FIG. 10, a substrate including sacrificial patterns 211 and metal patterns 191 may be formed using an operation similar to that described with reference to FIGS. 1, 2 and 3. The sacrificial patterns 211 and the second mold layer 150 of the substrate may be then removed to expose the support layer 130. The exposed support layer 130 may be patterned to form a supporter 131 that exposes the first mold layer 110. After formation of the supporter 131, the first mold layer 110 may be removed to expose the outer sidewalls of the metal patterns 191. After removal of the first mold layer 110, the metal patterns 191 may be etched using the etchant described in the previous embodiment, forming a metal electrode 197 having an uneven surface in the areas of the openings 170 which were etched.

The metal electrode 197 may have a first and second inner sidewall 197a and 197b, a first and second outer sidewall 197c and 197d, a first and second bottom surface 197e and 197f and a first and second top surface 197g and 197h. In one embodiment, the surfaces 197a, 197b, 197e, 197g and 197h have been subject to etching, portions of surfaces 195c and 197d have been subject to etching, portions of surfaces 197c and 197d have not been subject to etching, and surface 197f has not been subject to etching.

In the present embodiment, the uneven surface may be formed at inner sidewalls 197a and 197b, top surfaces 197g and 197h, a bottom surface 197e and the majority of the outer sidewalls 197c and 197d of the metal electrode 197. In one embodiment, the uneven surface may be formed at all surfaces of the metal electrode 197 that were etched using the etchant. In this embodiment, the remainder of the surface of the metal electrode 197 is even.

In one embodiment, each surface or portion of a surface of the metal electrode 197 that has not been subject to etching may be parallel with or perpendicular to a surface of the substrate 1. For example, the bottom surface 197f of the metal electrode 197 that has not been subject to etching may be parallel with the bottom surface of the substrate 1 and/or with the etch stop layer 29. In one embodiment, a portion of the surface of the metal electrode 197 that has not been subject to etching may be perpendicular a surface of the substrate 1. For example, a portion of the outer sidewall 197c of the metal electrode 197 that has not been subject to etching may be perpendicular to the bottom surface of the substrate 1 and/or the etch stop layer 29.

Figure 11:
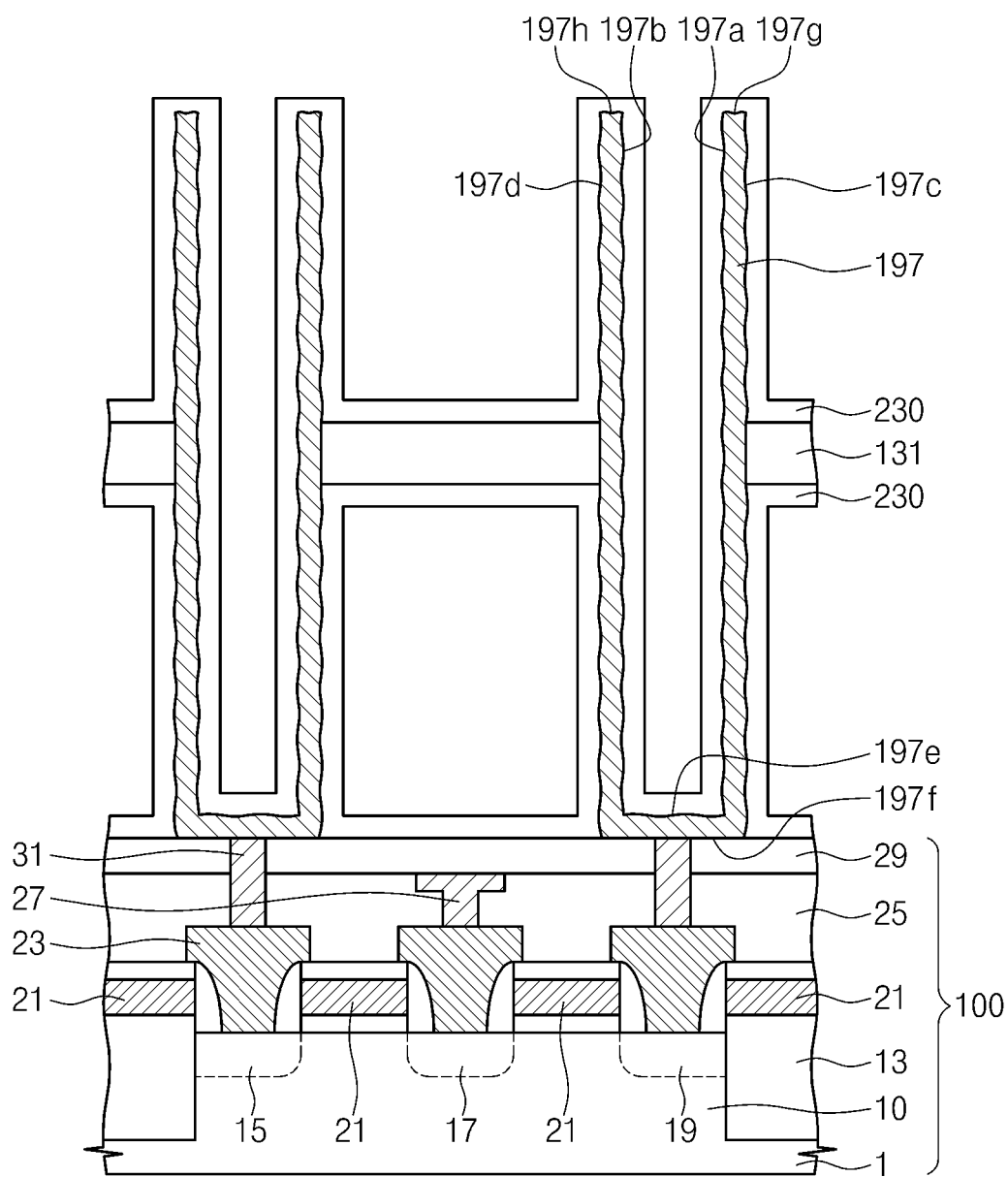

Referring to FIG. 11, in one embodiment, a conformal dielectric layer 230 may be formed on an entire surface of the substrate on which the metal electrodes 197 are formed. The dielectric layer 230 may be formed of, for example, a high-k dielectric layer having a dielectric constant higher than a dielectric constant of a silicon oxide layer. For example, the dielectric layer 230 may be formed of one of a lanthanum oxide (LaO) layer and a hafnium oxide (HfO) layer.

Figure 12:
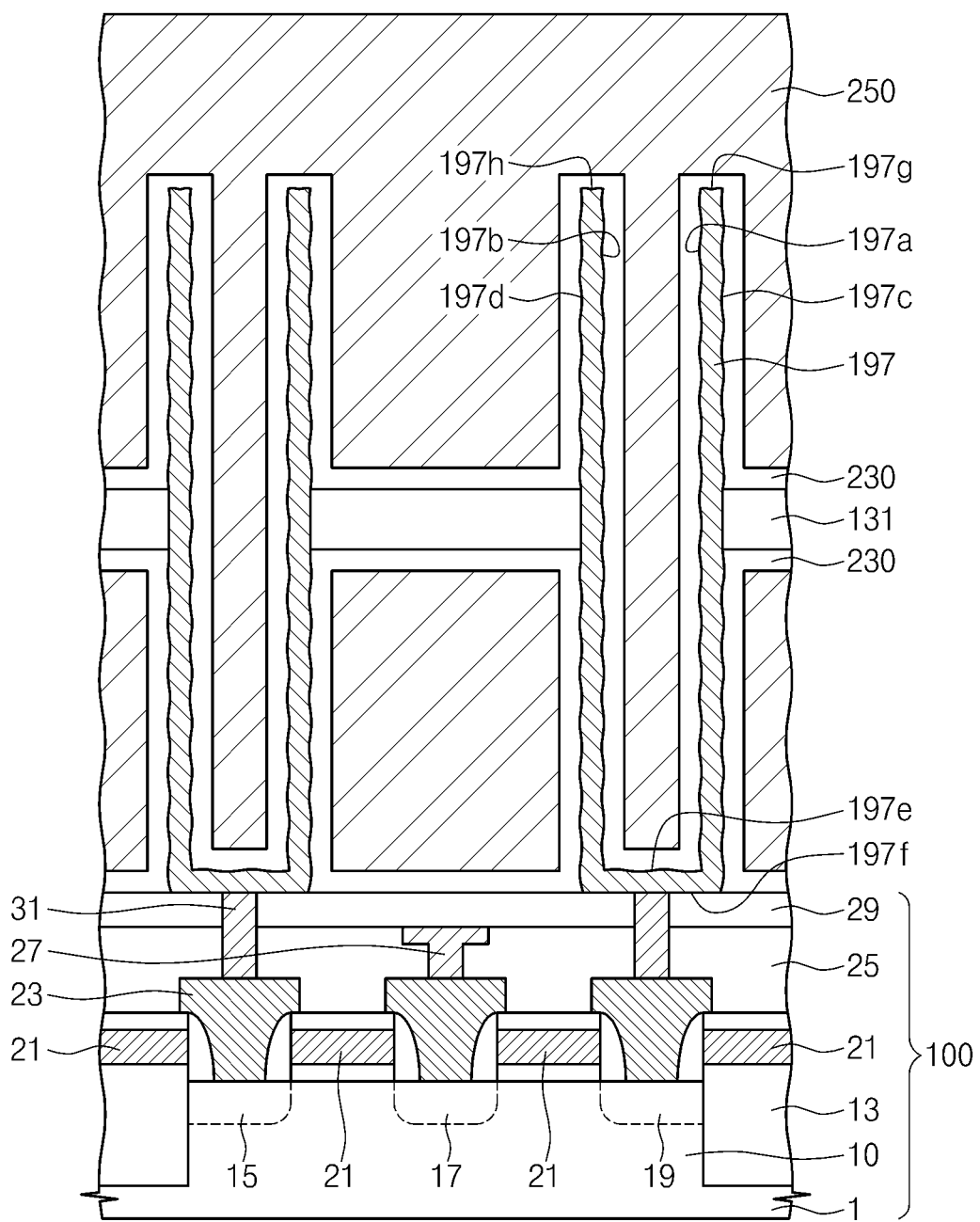

Referring to FIG. 12, a plate electrode 250 may be formed on the substrate on which the dielectric layer 230 is formed. The plate electrode 250 may be formed of a metallic material. For example, the plate electrode 250 may be a titanium nitride layer. In one embodiment, the plate electrode 250 may cover the surfaces of the dielectric layer 230 such that it surrounds the inner and outer surfaces of the metal electrode 193. In one embodiment, the metal electrode 193, the plate electrode 250 and the dielectric layer 230 form a capacitor.

In one embodiment, the metal pattern 191 is etched to have at least a portion of the surface in at least one of the openings be uneven. The amount of surface area of the resulting metal electrode, for example, metal electrode 193, 195 or 197, that is uneven corresponds to the amount of surface area of the metal pattern 191 that is etched using the etchant. In this embodiment, the surface area of the uneven surface of the resulting metal electrode 193, 195, or 197 is greater than the surface area of the corresponding surface of the metal pattern 191 before etching.

Figure 13A:
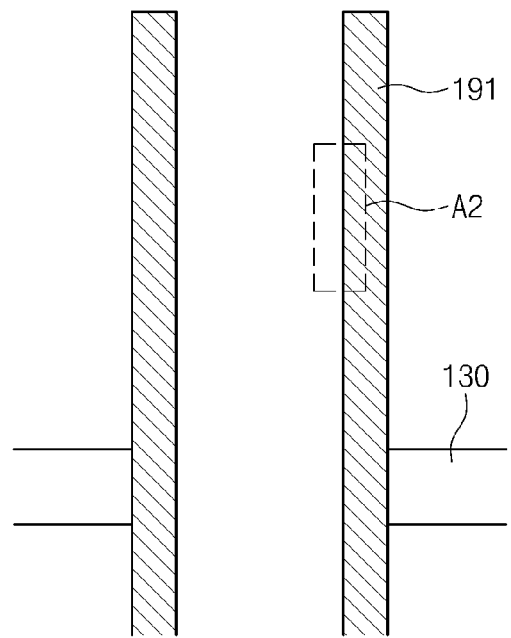
FIG. 13a is a close-up view of A1 in FIG. 3
Figure 13B:
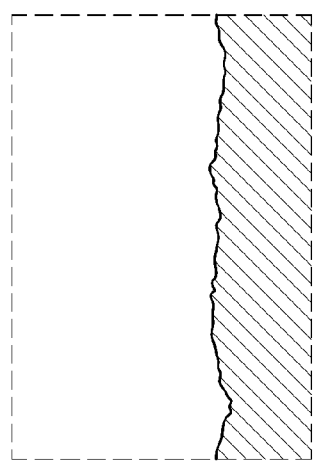
Figure 14A:
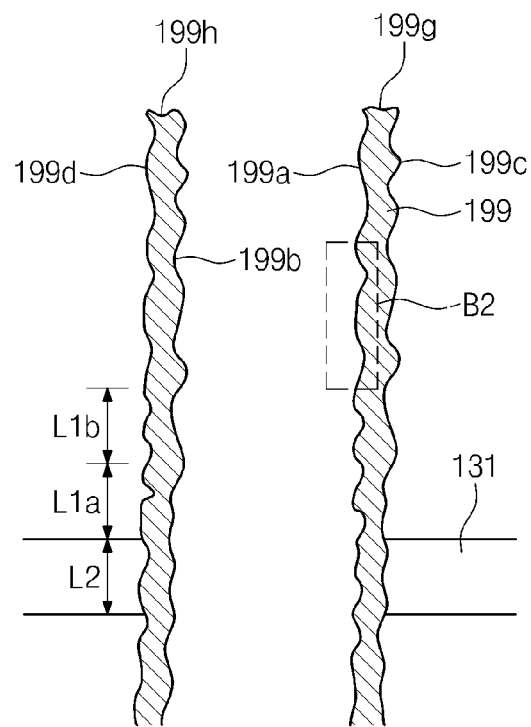
FIG. 14a is a close-up view of B1 in FIG. 10
Figure 14B:
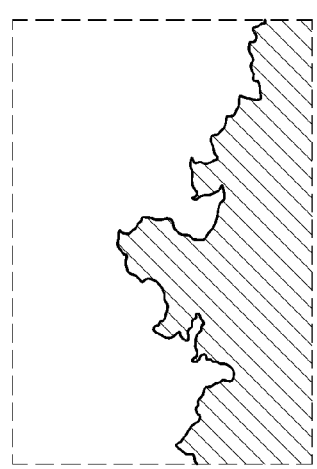

Referring to FIG. 13a, a metal pattern 191 may be formed on a substrate. FIG. 13b is a close-up view of one surface A2 of the metal pattern 191. Referring to FIG. 14a, an exemplary metal electrode 199 may be formed on a substrate. FIG. 14b is a close-up view of one surface B2 of the metal electrode 199 that has been subject to etching using the etchants described above, in a manner similar to that of metal electrodes 193, 195, and 197.

The surface area of the metal electrode 199 that has been etched is greater than the corresponding surface area of the metal pattern 191 exposed and ready to be etched. The area of the metal electrode 199 that has been etched may have an uneven surface. A portion of the metal electrode 199 of a length (e.g. L2) that does not have an etched surface has a lower surface area than a portion of the metal electrode 199 of an equivalent length (e.g. L1a or L1b) that has an etched surface. In one embodiment, a portion of the metal electrode 199 of a length (e.g. L1a) that has an etched surface may have a different surface area than another portion of the metal electrode 199 of equivalent length (e.g. L1b) that has also been etched. In one embodiment, the uneven surface comprises angles, curves, and/or edges that are not uniform. In one embodiment, a first portion of the metal electrode 199 of a length (e.g. L1a) that has been etched does not have a surface pattern similar to that of a second portion of the metal electrode 199 of an equivalent length (e.g. L1b) that was etched at the same time using the same etchants.

In one embodiment, parts of an uneven surface of the metal electrode 199 may overlap each other in one or more directions (e.g. vertical and/or horizontal directions). The width between the inner sidewall 199a and the outer sidewall 199c may differ along the length of a side of the metal electrode 199 as defined by the inner and outer sidewalls 199a and 199c. Similarly, the width between a portion of the inner and outer sidewalls 199a and 199c that has been subject to etching may be different than the width between a portion of the inner and outer sidewalls 199a and 199c that has not been subject to etching. In one embodiment, the width between a portion of the inner and outer sidewalls 199a and 199c that has been subject to etching is different than the width of another portion of the inner and outer sidewalls 199a and 199c that has been subject to etching.

In one embodiment, each surface or portion of a surface of the metal electrode 199 that has not been subject to etching may be parallel with or perpendicular to a surface of the substrate. For example, a surface of the metal electrode 199 which is adjacent to the supporter 131 that has not been subject to etching may be perpendicular to the bottom surface of the substrate 1 and/or with the etch stop layer 29. For example, a portion of the outer sidewall 199c of the metal electrode 199 that has not been subject to etching may be perpendicular to the bottom surface of the substrate 1 and/or the etch stop layer 29.

According to the embodiments set forth above, metal patterns are etched using an etchant to form metal electrodes having uneven surfaces. Thus, a surface area of the respective metal electrodes may be increased. As shown in the close-up views of the metal pattern 191 and the metal electrode 199 in FIGS. 13b and 14b, the surface area of an etched surface of the metal electrode is significantly greater than the surface area of a corresponding metal electrode. In one embodiment, the surface area of a surface of the metal pattern 191 may be increased by 20% by etching that surface to form a metal electrode 199. In some embodiments, the surface area of the etched portions of a metal electrode 199 may be larger by 50%, 75%, 100% or up to 125% as compared to the corresponding surfaces of the metal pattern 191. The amount of increase in surface area of the metal electrode 199 may depend upon, for example, the amount of surface of the metal electrode 199 that is subject to etching, and the amount of time the surface is exposed to the etchant. When the metal electrodes are used as storage nodes of a DRAM device, cell characteristics of the DRAM device may be significantly improved. In the event that a supporter between the metal electrodes is employed to enhance a structural stability, the supporter exhibits a relatively low etch rate (i.e. low etch selectivity compared to the metal patterns) while the metal patterns are etched using the etchant to form the uneven surfaces. Thus, even though the etchant is used to form the uneven surfaces, the supporter may still exist between the metal electrodes. The cell capacitance of the DRAM device may be increased while maintaining or increasing structural stability of the DRAM device. The increased cell capacitance means that the DRAM may be less likely to suffer soft errors, and a soft error rate of the DRAM may be low.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A method of fabricating a semiconductor device, the method comprising:
    forming a metal pattern on a substrate, the metal pattern formed in cylindrical shape having a bottom surface, an inner sidewall surface, and an outer sidewall surface;
    forming a supporter to support the metal pattern, the supporter adjacent to the outer sidewall surface, and not adjacent to the inner sidewall surface; and
    after forming the supporter, etching the metal pattern using an etchant including at least an alkaline solution and an oxidant to form a metal electrode,
    wherein at least a part of a surface of the metal electrode is uneven.

2. The method of claim 1, wherein the metal pattern includes at least one of a titanium layer, a titanium nitride layer, a ruthenium layer, a tungsten layer, a tungsten nitride layer, a tantalum layer and a tantalum nitride layer.

3. The method of claim 1, wherein the etchant further includes at least one of a chelating agent and a fluoride.

4. The method of claim 3, wherein the chelating agent includes at least one of an aliphatic amine type compound, a thiol type compound, a crown ether type compound, a hetero aromatic type compound and a carboxylic acidic type compound.

5. The method of claim 3, wherein the fluoride includes at least one of hydrofluoric acid (HF) and ammonium fluoride ($NH_4F$).

6. The method of claim 1, wherein the alkaline solution includes at least one of ammonium hydroxide ($NH_4OH$), tetra-methyl ammonium hydroxide (TMAH), sodium hydroxide (NaOH), potassium hydroxide (KOH) and choline ($C_5H_{15}O_2N$).

7. The method of claim 1, wherein the oxidant includes at least one of hydrogen peroxide ($H_2O_2$), ozone ($O_3$), sulfuric acid ($H_2SO_4$) and nitric acid ($HNO_3$).

8. The method of claim 1, wherein the semiconductor device includes a dynamic random access memory (DRAM) cell and the metal electrode is a capacitor.

9. A method of fabricating a dynamic random access memory (DRAM) cell, the method comprising:
    forming a substrate including one or more electrodes and an active region;
    sequentially forming a first mold layer, a support layer and a second mold layer on the substrate;
    forming a metal pattern penetrating the first mold layer, the support layer and the second mold layer; and
    wet etching at least a part of a surface of the metal pattern using a wet etchant to form a metal electrode;
    wherein the part of the surface of the metal electrode that has been formed by etching is uneven.

10. The method of claim 9, wherein the etchant includes at least an alkaline solution and an oxidant.

11. The method of claim 10, wherein the etchant further includes at least one of a chelating agent and a fluoride.

12. The method of claim 9, wherein the metal pattern is formed to have a cylindrical shape with a major axis which is perpendicular to a main surface of the substrate.

13. The method of claim 9, further comprising removing the first mold layer before etching the metal pattern.

14. The method of claim 9, further comprising removing the first and second mold layers before etching the metal pattern.

15. The method of claim 9, wherein a width of the uneven surface is variable.

16. A method of fabricating a dynamic random access memory (DRAM) cell, the method comprising:
    forming a substrate including one or more electrodes and an active region;
    sequentially forming a first mold layer, a support layer and a second mold layer on the substrate;
    forming a metal pattern penetrating the first mold layer, the support layer and the second mold layer; and
    etching the metal pattern to form a metal electrode;
    wherein a first part of a surface of the metal electrode is perpendicular to a surface of the substrate and a second part of the surface of the metal electrode is parallel with a surface of the substrate, and
    the first and second parts of a surface of the metal electrode include a jagged surface.

17. The method of claim 16, wherein the step of etching comprises using a wet etchant to form the metal electrode, wherein the wet etchant includes at least an alkaline solution and an oxidant.

18. The method of claim 17, wherein the etchant further includes at least one of a chelating agent and a fluoride.

19. The method of claim 16, wherein:
    the jagged surface of the metal electrode comprises at least one of a first portion and a second portion,
    the first portion of the jagged surface from a first point to a second point in a first direction has an equal length to the second portion of the jagged surface from a third point to a fourth point in the first direction, and
    the surface area of the first portion is different than the surface area of the second portion.

20. The method of claim 16, wherein:
    the jagged surface of the metal electrode has an equal length to a surface of the metal electrode has not been subject to the etching, and
    the surface area of the jagged surface of the metal electrode is greater than the surface of the metal electrode has not been subject to the etching.

* * * * *